US011732343B2

United States Patent
Bombillon et al.

(10) Patent No.: US 11,732,343 B2
(45) Date of Patent: Aug. 22, 2023

(54) PART COATED WITH A NON-HYDROGENATED AMORPHOUS CARBON COATING ON AN UNDERCOAT COMPRISING CHROMIUM, CARBON AND SILICON

(71) Applicant: HYDROMECANIQUE ET FROTTEMENT, Andrezieux Boutheon (FR)

(72) Inventors: Laurent Bombillon, Andrézieux-Bouthéon (FR); Fabrice Prost, Saint-Etienne (FR)

(73) Assignee: HYDROMECANIQUE ET FROTTEMENT, Andrezieux Boutheon (FR)

( * ) Notice: Subject to any disclaimer, the term of this patent is extended or adjusted under 35 U.S.C. 154(b) by 289 days.

(21) Appl. No.: 17/252,614

(22) PCT Filed: Jun. 17, 2019

(86) PCT No.: PCT/FR2019/051463
§ 371 (c)(1),
(2) Date: Dec. 15, 2020

(87) PCT Pub. No.: WO2019/243721
PCT Pub. Date: Dec. 26, 2019

(65) Prior Publication Data
US 2021/0310112 A1    Oct. 7, 2021

(30) Foreign Application Priority Data
Jun. 18, 2018 (FR) ...................................... 1855318

(51) Int. Cl.
C23C 14/02 (2006.01)
C23C 14/06 (2006.01)
C23C 28/04 (2006.01)
B32B 15/04 (2006.01)
C23C 14/32 (2006.01)

(52) U.S. Cl.
CPC ............ *C23C 14/027* (2013.01); *B32B 15/04* (2013.01); *C23C 14/0611* (2013.01); *C23C 14/325* (2013.01); *C23C 28/04* (2013.01); *C23C 28/046* (2013.01); *C23C 28/048* (2013.01)

(58) Field of Classification Search
None
See application file for complete search history.

(56) References Cited

U.S. PATENT DOCUMENTS

| 6,740,393 B1* | 5/2004 | Massler | .................. C23C 16/26 |
| | | | 428/408 |
| 7,160,616 B2* | 1/2007 | Massler | ............ H01J 37/32055 |
| | | | 427/249.7 |
| 2010/0314005 A1 | 12/2010 | Saito et al. | |
| 2014/0329070 A1 | 11/2014 | Draxler et al. | |
| 2017/0122249 A1 | 5/2017 | Procopio et al. | |
| 2018/0141102 A1 | 5/2018 | Honda | |

FOREIGN PATENT DOCUMENTS

| EP | 2 103 711 | 9/2009 |
| FR | 2 995 493 A1 | 3/2014 |
| JP | 2001-269938 | 10/2001 |
| JP | 2008-163430 A | 7/2008 |
| KR | 10-2017-0129876 A | 11/2017 |

OTHER PUBLICATIONS

Schultrich, "Tetrahedrally Bonded Amorphous Carbon Films I: Basics, Structure, and Preparation", Springer Series in Material Science 263, Springer-Verlag GmbH Germany 2018, ISBN 978-3-662-55925-3, 2018, p. 552.
Office Action issued in Korean Patent Application No. 10-2021-7001058, dated Aug. 27, 2022.
International Search Report for PCT/FR2019/051463 dated Sep. 23, 2019, 5 pages.
Written Opinion of the ISA for PCT/FR2019/051463 dated Sep. 23, 2019, 5 pages.
Office Action issued in India Patent Application No. 202017056265, dated Apr. 28, 2022.

* cited by examiner

*Primary Examiner* — Elizabeth Collister
(74) *Attorney, Agent, or Firm* — Nixon & Vanderhye

(57) ABSTRACT

Disclosed is a part comprising a metal substrate, a non-hydrogenated amorphous ta-C or aC carbon coating that coats the substrate, and an undercoat which is based on chromium (Cr), carbon (C) and silicon (Si) and is disposed between the metal substrate and the amorphous carbon coating and to which the amorphous carbon coating is applied, characterized in that the undercoat included, at its interface with the amorphous carbon coating, a ratio of silicon in atomic percent to chromium in atomic percent (Si/Cr) of 0.3 to 0.60, and a ratio of carbon in atomic percent to silicon in atomic percent (C/Si) of 2.5 to 3.5.

20 Claims, No Drawings

PART COATED WITH A NON-HYDROGENATED AMORPHOUS CARBON COATING ON AN UNDERCOAT COMPRISING CHROMIUM, CARBON AND SILICON

This application is the U.S. national phase of International Application No. PCT/FR2019/051463 filed Jun. 17, 2019 which designated the U.S. and claims priority to FR Patent Application No. 1855318 filed Jun. 18, 2018, the entire contents of each of which are hereby incorporated by reference.

BACKGROUND OF THE INVENTION

Field of the Invention

The present invention concerns a coated part comprising a metal substrate coated with a sub-layer and with a coating of non-hydrogenated amorphous carbon, the latter being deposited on the sub-layer comprising chromium, carbon and silicon.

Description of the Related Art

The parts considered here, comprising a coating, are for example friction members for the automotive, aeronautical or for instance space sectors.

In the automotive field, they are for example distribution parts such as finger followers, tappets or for instance cams to reduce the friction between those parts. They may also be piston pins, to reduce the wear thereof and protect the surfaces against dragging.

A coating as described here may also apply to components such as piston rings, piston skirts, liners.

In the preceding non-limiting examples, the coatings are often required to operate in a lubricated environment.

Naturally, coatings of amorphous carbon, whether or not hydrogenated, have multiple applications which are not limited to components for the automotive, aeronautical or space industries. Guiding or sliding members, for example such as molds in the plastics industry, may also be coated with such a coating to minimize wear and friction without lubrication.

Coatings of amorphous carbon are commonly called "DLC" (standing for "Diamond Like Carbon"). They designate carbon-based materials generally obtained in the form of a thin layer and by vacuum deposition technologies.

These coatings may for example be classified into two families: those comprising hydrogen (H) and those without hydrogen.

Among the coatings with hydrogen, DLC coatings of high industrial interest are:
  "a-C:H" coatings ("a-C:H" standing for "hydrogenated amorphous carbon"). These coatings are generally produced by vapor phase chemical deposition assisted by plasma of a carbon-based gaseous precursor (which is for example acetylene ($C_2H_2$)).

Among the coatings without hydrogen, DLC coatings of high industrial interest are:
  "a-C" coatings ("a-C" standing for "amorphous carbon"), which are generally produced by magnetron sputtering of a graphite target.
  And, especially, "ta-C" coatings ("ta-C" standing for "tetrahedral amorphous carbon"), which are generally produced by arc evaporation of a graphite target.

The aforementioned three types of coating are thus obtained by a different technology.

Furthermore, currently, for each type of DLC coating such as the aforementioned (formed with different technologies, as illustrated above), it is frequently necessary to employ a specific sub-layer in order for the coating to adhere to a given substrate.

For example, in the cases of coatings of ta-C, the adhesion is obtained by bombarding, at very high energy at the start of deposition (that is to say of the order of a few kilo-electronvolts), with carbon ions (C) on a substrate (this is for example described in the document: Tetrahedrally Bonded Amorphous Carbon Films I, Basics, Structure and Preparation, Bernd Schultrich, © Springer-Verlag GmbH Germany 2018 p. 552).

The substrate is optionally coated beforehand with a thin layer of metallic chromium (Cr), sometimes with a flash of chromium (Cr), so making it possible in particular to promote good adhesion on a steel substrate. This chromium layer is however optional and thus may be absent.

However, according to the state of the art, optimum adhesion is obtained, by bombarding relatively cold substrates with carbon ions (C), at high energy.

This condition is constraining since the initial steps which precede this bombarding (degassing the substrates and the machine by heating, ionic stripping and deposition of a flash of Cr) lead to heating of the parts and this heating is detrimental for the adhesion of the layer of ta-C. It is thus desirable to perform cooling of the substrates before bombarding them with energetic carbon ions. However, the effectiveness of cooling of parts (here substrates) under a vacuum is often poor and takes a lot of time, typically several hours, to obtain a desired temperature with a view to an adhesion considered acceptable.

Furthermore, as mentioned earlier, the adhesion is obtained by bombarding substrates, whether or not coated beforehand with a flash of chromium, with high energy carbon ions.

The high voltage necessary for the acceleration of the ions induces an increased risk of triggering phenomena of electrical arcs on the parts, or the part-carriers (also called substrate carriers), which may lead to destruction of the parts or to the loss of the adhesion of the parts exposed to the arc. Furthermore, if the bias generator of the parts detects an arc and cuts out, the deposition of the carbon ions occurs without acceleration which is detrimental to the adhesion of the carbon coating on the substrates thus exposed to the deposition.

Another drawback of this high energy phase of bombarding with carbon ions is the heating of the parts to coat resulting from the transfer of energy from the ions to the part to coat. The combination of the high density of carbon ions on the substrate and the high energy induces a high density of power applied to the substrate and thus a fast increase in its temperature.

In addition to the fact that this temperature rise may be detrimental to the characteristics of the mechanical parts of which the tempering temperatures are low, that is to say typically comprised between 150° C. and 220° C., this also being critical for the mechanical properties of the ta-C which collapse above a deposition temperature of approximately 200° C.

The usual methods can thus lead to risks of overheating the parts.

SUMMARY OF THE INVENTION

Thus, the present invention is directed to overcoming the aforesaid drawbacks at least partly.

In particular, an object of the invention is to provide a part, comprising a non-hydrogenated DLC coating, which has quite high mechanical properties and of which the DLC coating has satisfactory adhesion to the substrate.

The present invention is thus directed to providing a part which can be obtained without a cooling step before deposition in case of ta-C coating for example, that is to say of which the deposition method to obtain such a part makes it possible to dispense with the cooling step, prior to deposition of the ta-C coating, and with the use of the high energy ionic bombarding currently used to make the ta-C coating adhere.

DESCRIPTION OF THE PREFERRED EMBODIMENTS

To that end, according to a first aspect there is provided a part comprising a metal substrate, a non-hydrogenated amorphous carbon coating, of ta-C type or even of a-C type, coating the substrate, and a sub-layer based on chromium (Cr), carbon (C) and silicon (Si) disposed between the metal substrate and the amorphous carbon coating and on which the amorphous carbon coating is applied, characterized in that the sub-layer comprises the following atomic ratios at its interface with the amorphous carbon coating (that is to say at the surface of the sub-layer):

A ratio between the silicon content and the chromium content (Si/Cr) comprised between 0.35 and 0.60, and A ratio between the carbon content and the silicon content (Si/Cr) comprised between 2.5 and 3.5.

Such a sub-layer composition has contents which are for example measurable by EDX analysis (EDX standing for (Energy Dispersive X-Ray Spectrometry) in a scanning electron microscope (SEM) or by GDOES (Glow Discharge Optical Emission Spectroscopy).

It turns out that such a sub-layer makes it possible to obtain a coating adhesion result rated HF1, that is stable over time.

Furthermore, it turns out that such a sub-layer makes it possible to dispense with a cooling step, at least in the case of ta-C deposition, since, contrary to the state of the art, it is possible to commence the deposition of the carbon coating at very low bias voltages compared to the hundreds of volts according to the state of the art.

It also turns out that such a sub-layer enables a transition of the mechanical properties between a DLC coating of ta-C or a-C type and a metal substrate.

What is more, such a sub-layer has also proved to be particularly advantageous for a DLC coating of hydrogenated amorphous carbon, that is to say in particular of a-C:H type.

Such a sub-layer then takes the form of a gradient layer having a composition based mainly on chromium (Cr), silicon (Si) and carbon (C).

The sub-layer becomes progressively enriched (on going from the substrate towards the DLC coating) in silicon (Si) and in carbon (C), to attain a composition enabling the adhesion of the coating, as referred to above.

In a particular example, the ratio between the silicon content and the chromium content (Si/Cr) of the sub-layer in the vicinity of the interface with the DLC is comprised between 0.38 and 0.60, or even between 0.40 and 0.60.

In a particular example, the ratio between the carbon content and the silicon content (C/Si) of the sub-layer in the vicinity of the interface with the DLC is comprised between 2.8 and 3.2, or even between 2.9 and 3.1.

The sub-layer may possibly comprise nitrogen (N). This is particularly advantageous if the part further comprises a layer of chromium nitride, as described below.

Thus, in an advantageous example embodiment, the sub-layer further comprises atoms of nitrogen (N), a ratio between the nitrogen content and the chromium content (N/Cr) being less than 0.70 in the vicinity of the interface with the DLC, that is to say at the interface between the sub-layer and the amorphous carbon coating.

According to advantageous examples, the ratio between the nitrogen content and the chromium content (N/Cr) is comprised between 0.26 and 0.70, or even between 0.29 and 0.67, or even between 0.35 and 0.65, at the interface between the sub-layer and the amorphous carbon coating.

According to advantageous examples, the ratio between the silicon content and the chromium content (Si/Cr) is comprised between 0.40 and 0.55, or even between 0.45 and 0.55, at the interface between the sub-layer and the amorphous carbon coating.

In a favored example, the sub-layer, with or without nitrogen, has a thickness of a few tenths of a micrometer; preferably a thickness equal to or less than approximately 1.1 µm, for example comprised between approximately 0.2 µm and 1.1 µm, preferably comprised between approximately 0.3 µm and 0.6 µm.

As a matter of fact, in practice, beyond 1.1 µm a column-like development occurs, which is detrimental to the holding of the sub-layer, and below 0.2 µm, the sub-layer does not produce its effect of adaptation layer.

The amorphous carbon coating has for example a thickness equal to or greater than approximately 0.3 µm, or even than approximately 0.5 µm, or even than approximately 1 µm, or even than 1.5 µm.

The amorphous carbon coating has, for example a thickness equal to or less than approximately 10 µm, or even than 8 µm, or possibly even than approximately 3.5 µm.

The amorphous carbon coating has for example a thickness comprised between approximately 1.5 µm and approximately 3.5 µm, but may attain 8 µm when such a coating is applied to a piston ring for example.

The metal substrate is for example of steel or other metal alloys. In advantageous example embodiments, the part further comprises a chromium-based layer, deposited on the substrate and on which the sub-layer is formed.

The chromium-based layer is for example a layer of chromium (Cr) and/or a layer of chromium nitride, for example CrN or $Cr_2N$, or any intermediate compound.

Preferably, the part comprises a layer of chromium (Cr), or a layer of chromium (Cr) followed by a layer of chromium nitride (for example CrN or $Cr_2N$, or any intermediate compound).

Preferably, the chromium-based layer has a thickness of a few tenths of a micrometer, preferably a thickness equal to or less than approximately 1 µm, or even 0.6 µm, for example comprised between approximately 0.1 µm and 0.5 µm, or even between approximately 0.3 µm and 0.5 µm.

The table below presents different tests, numbered 1 to 15. The atomic ratios, measured by EDX, are those of the sub-layer in the vicinity of the interface with the coating (bearing in mind that the sub-layer exhibits a composition gradient, the composition aimed at is that towards which it tends at the interface with the DLC coating).

| No. | Th. of the Cr based layer (μm) | DLC th. (μm) | Total th. DLC + sub-layer + Cr based layer (μm) | Si/Cr | C/Si | N/Cr | HRC adhesion |
| --- | --- | --- | --- | --- | --- | --- | --- |
| 1 | 0 | 2.4 | 0.3 | 0.17 | 3.00 | 0.00 | no |
| 2 | 0 | 2.2 | 0.7 | 0.26 | 2.92 | 0.00 | no |
| 3 | 0 | 2.4 | 0.3 | 0.31 | 2.93 | 0.00 | no |
| 4 | 0 | 2.7 | 0.3 | 0.38 | 3.00 | 0.00 | yes |
| 5 | 0 | 2.4 | 0.7 | 0.46 | 3.06 | 0.00 | yes |
| 6 | 0 | 2.3 | 0.3 | 0.60 | 2.94 | 0.00 | yes |
| 7 | 0 | 2.3 | 0.5 | 0.76 | 2.95 | 0.00 | no |
| 8 | 0 | 2.5 | 0.5 | 1.00 | 3.00 | 0.00 | no |
| 9 | 0.3 | 2.8 | 0.6 | 0.50 | 3.00 | 0.33 | yes |
| 10 | 0.5 | 2.4 | 1.1 | 0.43 | 2.92 | 0.67 | yes |
| 11 | 0.3 | 2.3 | 0.7 | 0.33 | 3.00 | 1.00 | no |
| 12 | 0.4 | 2.5 | 0.7 | 0.33 | 2.92 | 0.25 | no |
| 13 | 0.3 | 2.5 | 0.8 | 0.40 | 2.93 | 0.29 | yes |
| 14 | 0 | 3.5 | 1.1 | 0.50 | 3.00 | 0.00 | yes |
| 15 | 0 | 1.5 | 0.4 | 0.45 | 3.10 | 0.00 | yes |

In all the tests, it is observed that the adhesion behavior of the DLC on the sub-layer is linked to the composition of the surface of the sub-layer.

The presence of nitrogen at the surface is not decisive for the adhesion of the DLC. As a matter of fact, for nitrogen proportions (N/Cr) that are similar (Examples 9, 12 and 13), the adhesion may be judged good or not good. A relatively strong presence of nitrogen may adversely affect the adhesion, as in Example 11. The absence of nitrogen may lead to good adhesion (Examples 4 to 6, 14 and 15) or not (Examples 1 to 3, 7, 8).

In contrast, the proportion of chromium has proved to be a more decisive factor. The proportion of chromium is defined by the Si/Cr ratio, and the N/Cr ratio if nitrogen is present. A relatively high proportion of chromium does not appear to be suitable for the adhesion (e.g. Examples 1 to 3). A relatively low proportion of chromium does not appear to be suitable for the adhesion of the DLC either (e.g. Examples 7 and 8).

Thus, when the ratio of the Si/Cr compositions is comprised between 0.35 and 0.6, all the DLC layers deposited on these sub-layers proved to be adherent (Examples 4, 5, 6, 9, 10, 13, 14 and 15).

To obtain a coating such as described above, vacuum deposition equipment such as described below is used.

The vacuum deposition equipment mainly comprises a chamber, a pumping system, a heating system, which are configured to pump and heat the parts (substrate) and within the chamber, in order to accelerate the desorption of the gases and rapidly obtain a vacuum, considered as being of quality, within the chamber.

The deposition equipment further comprises a substrate carrier, which is suited, from the point of view of geometry, electrical bias and kinematics, to the parts, or to the portion of the parts to coat.

The vacuum deposition equipment also comprises an ionic stripping system configured to bombard the parts (substrates) to coat with argon (Ar) ions, in order to eliminate a passivation layer generally present on metal substrates to coat.

In the context of a ta-C coating, numerous different technologies for ionic stripping can be suitable. The same applies for an a-C coating.

The vacuum deposition equipment also comprises a magnetron cathode, equipped with a chromium target, to generate the chromium-based layers.

Preferably, the ionic stripping system is configured to operate simultaneously with the magnetron cathode. The end of the ionic stripping is thus taken advantage of to pre-sputter the magnetron cathode equipped with a chromium target.

Such equipment is thus particularly advantageous since it also enables satisfactory coatings of a-C:H type to be deposited.

For example, the plasma source such as that described in document FR 2 995 493 may be implemented to perform effective ionic stripping of the parts to coat and coat them with a DLC coating of ta-C, or a-C, or even a-C:H type.

The step of depositing the sub-layer is for example configured to produce a sub-layer having a composition such as described above.

The step of depositing the sub-layer is for example configured furthermore to produce a sub-layer having a thickness such as described above.

In an example of implementation, the method may optionally comprise a step of depositing metallic chromium, for example a step of sputtering chromium.

Optionally, this step of depositing metallic chromium comprises a step of introducing nitrogen simultaneously with the step of sputtering chromium so as to obtain a layer of chromium nitride, for example CrN or $Cr_2N$ or any intermediate compound.

Such a chromium-based layer, optionally with nitrogen, is deposited with a thickness of a few tenths of a micrometer, as described above.

The deposition continues with the introduction of an organosilicon gas, that is to say a gas carrying at least silicon, typically tetramethylsilane (also called TMS, of formula $Si(CH_3)_4$), which may include traces of oxygen) which is the easiest to implement, or a mixture of silane and a hydrocarbon. Without being exclusive, TMS is by far used preferentially for its relatively high chemical stability and its high volatility enabling easy implementation for it by means of a mass flow meter.

In case of prior deposition of a chromium based layer (Cr, and/or CrN or $Cr_2N$), the organosilicon gas is introduced at increasing rate up to a flow rate at which the silicon content of the sub-layer is at least equal to approximately 0.35 times its chromium content and at most approximately 0.60 times the chromium content in the vicinity of the interface. The ratio of the carbon content to the silicon content is in parallel comprised between 2.5 and 3.5 in the vicinity of the interface.

When a chromium-based layer with nitrogen is used, the quantity of nitrogen injected may be gradually reduced when the quantity of organosilicon gas increases. The quantity of nitrogen is not necessarily brought to 0 but must become notably less than that of organosilicon gas. The nitrogen introduced to produce a layer of CrN (or $Cr_2N$) may also be abruptly brought down to 0 before introducing the organosilicon precursor. Nevertheless, the progressive reduction in the nitrogen is a preferred embodiment since it enables progressive transition of nitrogen in the sub-layer.

By way of example, considering a layer of CrN, N/Cr then has the value for example of 1 and thus the quantity of nitrogen is possibly considered excessive. Considering a layer of $Cr_2N$, N/Cr then has the value for example 0.5 and in such a case, this ratio may be kept.

During the production of the various thin layers under a vacuum described above (chromium-based layer, sub-layer or for instance DLC coating), the bias voltage of the substrate carrier is generally situated between −50 V and −100 V (volt).

The partial pressure of argon during the deposition of these layers is preferably situated between 0.2 Pa and 0.4 Pa.

When the flow rate of organosilicon gas has reached the required level, the electrical supply of the magnetron cathode is cut, the reactive gases (that is to say the organosilicon gas, or the organosilicon gas and the nitrogen according to the case) are stopped. The flow rate of argon, where provided, is reduced to a low value or even brought to 0, to begin the deposition of ta-C using sources of arc, or the deposition of a-C.

The invention claimed is:

1. Part comprising a metal substrate, a non-hydrogenated amorphous ta-C or a-C carbon coating, coating the substrate, and a sub-layer based on chromium (Cr), carbon (C) and silicon (Si) disposed between the metal substrate and the amorphous carbon coating and on which the amorphous carbon coating is applied, wherein the sub-layer comprises the following atomic ratios at the sub-layer's interface with the amorphous carbon coating:

A ratio between the silicon content and the chromium content (Si/Cr) comprised between 0.35 and 0.60, and A ratio between the carbon content and the silicon content (C/Si) comprised between 2.5 and 3.5.

2. The part according to claim 1, wherein the ratio between the silicon content (Si) and the chromium content (Cr) (Si/Cr) of the sub-layer is comprised between 0.38 and 0.6.

3. The part according to claim 2, wherein the ratio between the carbon content (C) and the silicon content (Si) (C/Si) of the sub-layer is comprised between 2.8 and 3.2.

4. The part according to claim 2, wherein the sub-layer further comprises atoms of nitrogen (N), a ratio between the nitrogen content and the chromium content (N/Cr) being less than 0.70 at the interface between the sub-layer and the amorphous carbon coating.

5. The part according to claim 1, wherein the ratio between the carbon content (C) and the silicon content (Si) (C/Si) of the sub-layer is comprised between 2.8 and 3.2.

6. The part according to claim 5, wherein the sub-layer further comprises atoms of nitrogen (N), a ratio between the nitrogen content and the chromium content (N/Cr) being less than 0.70 at the interface between the sub-layer and the amorphous carbon coating.

7. The part according to claim 1, wherein the sub-layer further comprises atoms of nitrogen (N), a ratio between the nitrogen content and the chromium content (N/Cr) being less than 0.70 at the interface between the sub-layer and the amorphous carbon coating.

8. The part according to claim 7, wherein the ratio between the nitrogen content and the chromium content (N/Cr) is comprised between 0.26 and 0.70 and the ratio between the silicon content and the chromium content (Si/Cr) is comprised between 0.40 and 0.55 at the interface between the sub-layer and the amorphous carbon coating.

9. The part according to claim 1, wherein the sub-layer has a thickness equal to or less than 1.1 μm.

10. The part according to claim 1, wherein the amorphous carbon coating has a thickness equal to or greater than 0.3 μm.

11. The part according to claim 1, wherein the amorphous carbon coating has a thickness comprised between 1.5 μm and 3.5 μm.

12. The part according to claim 1, further comprising a chromium-based layer, deposited on the substrate and on which the sub-layer is formed, the chromium-based layer being a layer of chromium (Cr) and/or a layer of chromium nitride, or any intermediate compound.

13. The part according to claim 12, wherein the chromium-based layer has a thickness equal to or less than 1 μm.

14. The part according to claim 12, wherein the chromium-based layer has a thickness equal to or less than 0.6 μm.

15. The part according to claim 12, wherein the chromium-based layer has a thickness comprised between 0.1 μm and 0.5 μm.

16. The part according to claim 12, wherein the chromium-based layer has a thickness comprised between 0.3 μm and 0.5 μm.

17. The part according to claim 1, wherein the sub-layer has a thickness comprised between 0.3 μm and 0.6 μm.

18. The part according to claim 1, wherein the amorphous carbon coating has a thickness equal to or greater than 0.5 μm.

19. The part according to claim 1, wherein the amorphous carbon coating has a thickness equal to or greater than 1 μm.

20. The part according to claim 1, wherein the ratio between the carbon content (C) and the silicon content (Si) (C/Si) of the sub-layer is comprised between 2.9 and 3.1.

* * * * *